(12) United States Patent  (10) Patent No.: US 8,329,572 B2
Isono  (45) Date of Patent: Dec. 11, 2012

(54) SEMICONDUCTOR DEVICE AND METHOD FOR FABRICATING THE SAME

(75) Inventor: Shunsuke Isono, Osaka (JP)

(73) Assignee: Panasonic Corporation, Osaka (JP)

( * ) Notice: Subject to any disclaimer, the term of this patent is extended or adjusted under 35 U.S.C. 154(b) by 82 days.

(21) Appl. No.: 13/051,415

(22) Filed: Mar. 18, 2011

(65) Prior Publication Data
US 2011/0171824 A1 Jul. 14, 2011

Related U.S. Application Data

(62) Division of application No. 12/153,028, filed on May 13, 2008, now Pat. No. 7,935,623, which is a division of application No. 11/716,704, filed on Mar. 12, 2007, now Pat. No. 7,400,045, which is a division of application No. 10/945,920, filed on Sep. 22, 2004, now Pat. No. 7,215,028.

(30) Foreign Application Priority Data

Sep. 26, 2003 (JP) ................................. 2003-335185

(51) Int. Cl.
*H01L 21/4763* (2006.01)
(52) U.S. Cl. ........ 438/618; 438/620; 438/631; 438/637; 438/672; 438/673; 438/700; 257/E21.59; 257/E21.641
(58) Field of Classification Search .................. 438/618, 438/620, 622, 672, 673, 700, 631, 637; 257/E21.59, 257/E21.641
See application file for complete search history.

(56) References Cited

U.S. PATENT DOCUMENTS

| | | | |
|---|---|---|---|
| 6,114,243 A | 9/2000 | Gupta et al. | |
| 6,281,535 B1 | 8/2001 | Ma et al. | |
| 6,313,028 B2 | 11/2001 | Huang et al. | |
| 6,417,116 B2 | 7/2002 | Kudo et al. | |
| 6,479,366 B2 | 11/2002 | Miyamoto | |
| 6,589,863 B1 | 7/2003 | Usami | |
| 6,730,590 B2 | 5/2004 | Ohashi et al. | |
| 6,828,222 B2 | 12/2004 | Oyamatsu | |

(Continued)

FOREIGN PATENT DOCUMENTS

JP 8-83780 A 3/1996

(Continued)

OTHER PUBLICATIONS

Japanese Office Action issued in corresponding Japanese Patent Application No. 2003-335185, dated Aug. 22, 2006.

(Continued)

*Primary Examiner* — Long Tran
(74) *Attorney, Agent, or Firm* — McDermott Will & Emery LLP (57) ABSTRACT

In a method for fabricating a semiconductor device, first, a first metal interconnect is formed in an interconnect formation region, and a second metal interconnect is formed in a seal ring region. Subsequently, by chemical mechanical polishing or etching, the upper portions of the first metal interconnect and the second metal interconnect are recessed to form recesses. A second insulating film filling the recesses is then formed above a substrate, and the upper portion of the second insulating film is planarized. Next, a hole and a trench are formed to extend halfway through the second insulating film, and ashing and polymer removal are performed. Subsequently to this, the hole and the trench are allowed to reach the first metal interconnect and the second metal interconnect.

7 Claims, 7 Drawing Sheets

U.S. PATENT DOCUMENTS

| | | |
|---|---|---|
| 6,838,370 B1 | 1/2005 | Niuya et al. |
| 6,908,847 B2 | 6/2005 | Saito et al. |
| 7,041,586 B2 | 5/2006 | Kudo et al. |
| 2002/0079585 A1 | 6/2002 | Wong |
| 2002/0125577 A1 | 9/2002 | Komada |
| 2002/0155702 A1 | 10/2002 | Aoki et al. |
| 2003/0003733 A1 | 1/2003 | Ohashi et al. |
| 2003/0020168 A1* | 1/2003 | Watanabe et al. ............. 257/760 |
| 2003/0118798 A1 | 6/2003 | Fuji |
| 2005/0054122 A1 | 3/2005 | Celii et al. |
| 2005/0085066 A1 | 4/2005 | Tsao et al. |

FOREIGN PATENT DOCUMENTS

| | | |
|---|---|---|
| JP | 08-264538 | 10/1996 |
| JP | 11-145288 A | 5/1999 |
| JP | 11-274122 A | 10/1999 |
| JP | 2000-174123 A | 6/2000 |
| JP | 2002-118078 A | 4/2002 |
| JP | 2002-246391 | 8/2002 |
| JP | 2002-270608 A | 9/2002 |
| JP | 2002-289689 A | 10/2002 |
| JP | 2002-373937 A | 12/2002 |
| JP | 2003-133314 A | 5/2003 |

OTHER PUBLICATIONS

Japanese Notice of Reasons for Rejection, with English Translation, issued in Japanese Patent Application No. 2006-281346, mailed on Oct. 5, 2010.

* cited by examiner

SEMICONDUCTOR DEVICE AND METHOD FOR FABRICATING THE SAME

CROSS REFERENCE TO RELATED APPLICATIONS

This application is a Divisional of U.S. application Ser. No. 12/153,028, filed on May 13, 2008, now U.S. Pat. No. 7,935,623 which is a Divisional of U.S. application Ser. No. 11/716,704, filed Mar. 12, 2007, now U.S. Pat. No. 7,400,045, which is a Divisional of U.S. application Ser. No. 10/945,920, filed Sep. 22, 2004, now U.S. Pat. No. 7,215,028, and claims priority under 35 U.S.C. §119 on Patent Application No. 2003-335185 filed in Japan on Sep. 26, 2003, the entire contents of each of which are hereby incorporated by reference.

BACKGROUND OF THE INVENTION (a) Fields of the Invention

The present invention relates to semiconductor devices and methods for fabricating the same. In particular, the present invention relates to semiconductor devices having contact portions of conductor (referred hereinafter to as conductor contact portions) on an interconnect layer and methods for fabricating such a device.

(b) Description of Related Art

In recent years, miniaturization and high degree of integration of semiconductor integrated circuits have been rapidly proceeding. In accordance with the proceeding miniaturization of the circuit, delay time caused by transistor operation can be cut in the device while interconnect resistance and parasitic capacitance increase therein. This makes it difficult to cut delay time caused in an interconnect. In a measure to cut the interconnect delay time, in order to reduce the interconnect resistance, copper having a lower resistivity than aluminum used as a conventional interconnect material is employed as a substitute for aluminum. Moreover, in order to reduce the parasitic capacitance, an insulating film having a low dielectric constant is employed as a material for an interlayer insulating film and the like.

Copper is difficult to etch. Therefore, formation of an interconnect with copper is made by a damascene process: a hole pattern and a trench configuration are formed in an insulating film, after which the patterns are filled with copper.

In a chip of a semiconductor device, a trench configuration called a seal ring is formed to protect transistors and interconnects provided in the chip against outside moisture. The seal ring is formed to surround an area containing the transistors and the interconnects. The seal ring is formed simultaneously with the etching for forming a hole pattern (vias).

The hole pattern and the trench configuration serving as the seal ring are formed in the following manner.

First, to form the hole pattern and the trench configuration, an interlayer insulating film is halfway removed using photoresist as a mask. The reason why the removal is stopped halfway is that if an interconnect layer located below the hole pattern and the trench configuration is exposed therefrom during the removal, the interconnect layer corrodes during subsequent ashing for removing the photoresist and subsequent polymer removal. To avoid such a problem, ashing and polymer removal are performed with only part of the thickness of the interlayer insulating film remaining. Thereafter, using the resulting interlayer insulating film itself as a mask, the hole pattern and the trench configuration are made to reach the interconnect layer.

However, the conventional semiconductor device has caused the following problems.

Generally, during etching, the etching rate rises as the area of an opening increases. In this device, the opening area of the trench is greater than that of the hole. Thus, when the trench and the hole are formed at the same time by a single etching, the trench is formed deeper. Therefore, it might be unable to stop etching of the trench halfway through the interlayer insulating film, resulting in exposure of metal of the interconnect layer located therebelow. If the metal is exposed in this process, then the disadvantage arises that the metal corrodes by subjecting itself to subsequent photoresist removal by ashing and to subsequent polymer removal.

Such a disadvantage also arises when the interlayer insulating film is formed with multiple types of hole patterns. Specifically, the hole patterns have different pattern densities or the like, so that it is impossible, in forming the different hole patterns, to partly remove the insulating film to form the hole patterns with a uniform depth. This causes the disadvantage that the interconnect layer located below the hole patterns is exposed.

SUMMARY OF THE INVENTION

An object of the present invention is to provide a method for fabricating a semiconductor device resistant to metal corrosion in an interconnect layer by taking measures to prevent exposure of the interconnect layer during formation of a hole pattern and a trench pattern.

A first semiconductor device of the present invention comprises: a semiconductor substrate; a first insulating film provided over the semiconductor substrate; an interconnect layer provided in at least an upper portion of the first insulating film; a second insulating film provided on the first insulating film and the interconnect layer; a third insulating film provided on the second insulating film; and at least one conductor contact portion passing through the third insulating film and the second insulating film to reach the interconnect layer. In this device, an upper portion of the interconnect layer is provided with a recess and a portion of the second insulating film located on the interconnect layer has a greater thickness than a portion thereof located on the first insulating film.

With this device, the portion of the second insulating film located on the interconnect layer is formed thick. Therefore, in the step of partly removing the third insulating film and the second insulating film to form the conductor contact portion, part of the second insulating film can be easily left on the interconnect layer, which makes it difficult to expose the interconnect layer. The semiconductor surface in this condition can be subjected to a process that may corrode metal, such as ashing or polymer removal. Subsequently, the unremoved parts of the third insulating film and the second insulating film can be removed to expose the interconnect layer, and a conductor for the conductor contact portion can fill the removed portion. That is to say, a process that may corrode metal can be carried out on the semiconductor surface with the interconnect layer not exposed, whereby corrosion of the interconnect layer can be prevented.

On the other hands, all portions of the second insulating film but the portion located on the interconnect layer are not formed thick. Therefore, the dielectric constant between the layers can be kept constant.

The interconnect layer may comprise a first interconnect layer. The conductor contact portion may comprise a first conductor contact portion. The device may further comprise: a second interconnect layer provided in at least an upper portion of the first insulating film; and a second conductor contact portion passing through the third insulating film and the second insulating film to reach the second interconnect layer. A portion of the second insulating film located on the first interconnect layer may have a greater thickness than a portion thereof located on the second interconnect layer. In this case, even if the third insulating film and the second insulating film are partly removed in order to form the conductor contact portion, it can become difficult to expose the first interconnect layer because the region of the second insulating film formed with the first conductor contact portion is formed thick. As is the case where the area in which the first conductor contact portion is formed is greater than the area in which the second conductor contact portion is formed, when the third insulating film and the second insulating film are partly removed to form the conductor contact portion, the region where the first conductor contact portion is formed is removed deeper. Even in such a circumstance, it can become difficult to expose the first interconnect layer.

The first interconnect layer may have a greater width than the second interconnect layer. In this case, the region where the first interconnect layer is formed has a higher area ratio of conductor (metal) than the region where the second interconnect layer is formed. Therefore, when chemical mechanical polishing or similar treatment is carried out on the first interconnect layer and the second interconnect layer from above, the recess formed in the upper portion of the first interconnect layer can be deepened by the metal area ratio dependence of dishing.

As shown in FIGS. 7A-7F, a dummy interconnect layer may be formed beside the first interconnect layer. In this case, the surrounding of the region where the first interconnect layer is formed has a higher area ratio of conductor (metal) than the surrounding of the region where the second interconnect layer is formed. Therefore, when chemical mechanical polishing or similar treatment is carried out on the first interconnect layer and the second interconnect layer from above, the recess formed in the upper portion of the first interconnect layer can be deepened by the metal area ratio dependence of dishing.

The first conductor contact portion may be of rectangular or strip-like plane, and the second conductor contact portion may be of circular or square plane.

The first interconnect layer and the first conductor contact portion may constitute a seal ring provided in ring shape. In this case, even though the first conductor contact portion serving as the seal ring differs greatly in area from the second conductor contact portion, the structure described above can prevent the first interconnect layer from being exposed.

An element may be provided in the semiconductor substrate, and the interconnect layer may be electrically connected to the element. In this case, when the third insulating film and the second insulating film are partly removed in forming the conductor contact portion, an error would arise in the depth to be removed. Even though such an error arises, it can become difficult to expose the interconnect layer.

The second insulating film is preferably an insulating film of silicon compound containing carbon.

A second semiconductor device of the present invention comprises: a semiconductor substrate; a first insulating film provided on the semiconductor substrate; an interconnect layer provided in at least an upper portion of the first insulating film; an oxidation-resistant conductor film covering the top of the interconnect layer; a second insulating film provided on the first insulating film and the oxidation-resistant conductor film; a third insulating film provided on the second insulating film; and at least one conductor contact portion passing through the third insulating film and the second insulating film to reach the oxidation-resistant conductor film.

With this device, even if, in the step of partly removing the third insulating film and the second insulating film to form the conductor contact portion, treatment that may corrode metal, such as ashing and polymer removal, is carried out on the semiconductor surface with the oxidation-resistant conductor film exposed, corrosion of the interconnect layer can be prevented. On the other hands, all portions of the second insulating film but the portion located on the interconnect layer are not formed thick. Therefore, the dielectric constant between the layers can be kept constant.

The oxidation-resistant conductor film may be a nitrogen introduced layer produced by introducing nitrogen into an upper region of the interconnect layer.

The oxidation-resistant conductor film may be made of titanium nitride.

The interconnect layer comprises a first interconnect layer. The oxidation-resistant conductor film comprises a first oxidation-resistant conductor film provided on the first interconnect layer. The conductor contact portion comprises a first conductor contact portion. The device comprises: a second interconnect layer provided in at least an upper portion of the first insulating film; a second oxidation-resistant conductor film covering the top of the second interconnect layer; and a second conductor contact portion passing through the third insulating film and the second insulating film to reach the second oxidation-resistant conductor film. The first conductor contact portion has a greater upper surface area than the second conductor contact portion. In this case, if the third insulating film and the second insulating film are partly removed in forming these conductor contact portions, the region where the first conductor contact portion is formed is removed deeper. However, since the top of the first interconnect layer is covered with the oxidation resistant film, corrosion of the first interconnect layer can be prevented even though the oxidation resistant film is exposed.

The first conductor contact portion may be of rectangular or strip-like plane, and the second conductor contact portion may be of circular or square plane.

The first interconnect layer and the first conductor contact portion may constitute a seal ring provided in ring shape. In this case, even though the first conductor contact portion serving as the seal ring differs greatly in area from the second conductor contact portion, the structure described above can prevent the first interconnect layer from being exposed.

An element may be provided in the semiconductor substrate, and the interconnect layer may be electrically connected to the element. In this case, when the third insulating film and the second insulating film are partly removed in forming the conductor contact portion, an error would arise in the depth to be removed. Even though such an error arises, it can become difficult to expose the interconnect layer.

The second insulating film is preferably an insulating film of silicon compound containing carbon.

A first method for fabricating a semiconductor device according to the present invention comprises: the step (a) of forming a first insulating film on a semiconductor substrate; the step (b) of forming an interconnect layer in at least an upper portion of the first insulating film; the step (c) of forming a recess in an upper portion of the interconnect layer; the step (d) of forming, on the first insulating film and the interconnect layer, a second insulating film filling the recess; the step (e) of planarizing an upper surface of the second insulating film; the step (f) of forming a third insulating film on the second insulating film after the step (e); the step (g) of removing, using a photoresist as a mask, portions of the third insulating film and the second insulating film located above the interconnect layer so that the removed part does not reach the interconnect layer, thereby leaving part of the second insulating film on the interconnect layer; and the step (h) of removing the photoresist.

With this method, the portion of the second insulating film located on the interconnect layer can be formed thick. Therefore, in the step (g), the state in which the interconnect layer is not exposed can be kept more certainly. This prevents corrosion of the interconnect layer even though treatment that may corrode metal, such as ashing, is carried out after the step (g). On the other hands, all portions of the second insulating film but the portion located on the interconnect layer are not formed thick. Therefore, in the semiconductor device fabricated by the first method, the dielectric constant between the layers can be kept constant.

In the step (c), the upper portion of the interconnect layer may be recessed by chemical mechanical polishing, dry etching, or wet etching to form the recess. In this case, in addition to the above effect, the effect of improving the adhesion between the first insulating film and the second insulating film can be provided.

In the step (b), a first interconnect layer for a seal ring and a second interconnect layer located in a region surrounded with the first interconnect layer may be formed as the interconnect layer. In the step (c), the recess may be formed in at least an upper portion of the first interconnect layer. In the step (g), portions of the third insulating film and the second insulating film located above the first interconnect layer may be partly removed to form a trench for the seal ring, and portions of the third insulating film and the second insulating film located above the second interconnect layer may be partly removed to form a hole. Since, in this case, the opening area of the trench is greater than that of the hole, the trench is formed to have a greater depth than the hole in the step (g). However, the region of the second insulating film to be formed with the trench is formed thick, whereby it can become difficult to expose the first interconnect layer.

In the step (b), the first interconnect layer may be formed to have a greater width than the second interconnect layer. In this case, the region where the first interconnect layer is formed has a higher area ratio of conductor (metal) than the region where the second interconnect layer is formed. Therefore, when, in the step (c), chemical mechanical polishing or similar treatment is carried out on the first interconnect layer and the second interconnect layer from above, the recess formed in the upper portion of the first interconnect layer can be deepened by the metal area ratio dependence of dishing.

In the step (b), a dummy interconnect layer may be formed beside the first interconnect layer. In this case, the surrounding of the region where the first interconnect layer is formed has a higher area ratio of conductor (metal) than the surrounding of the region where the second interconnect layer is formed. Therefore, when, in the step (c), chemical mechanical polishing or similar treatment is carried out on the first interconnect layer and the second interconnect layer from above, the recess formed in the upper portion of the first interconnect layer can be deepened by the metal area ratio dependence of dishing.

The first method may further comprise, prior to the step (a), the step (i) of forming an element in the semiconductor substrate. In the step (b), the interconnect layer may be formed to be electrically connectable to the element. In this case, even though an error in the depth to be removed arises in the step (g), it can become difficult to expose the interconnect layer.

A second method for fabricating a semiconductor device according to the present invention comprises: the step (a) of forming a first insulating film on a semiconductor substrate; the step (b) of forming an interconnect layer in at least an upper portion of the first insulating film; the step (c) of forming an oxidation-resistant conductor film covering the top of the interconnect layer; the step (d) of forming a second insulating film on the first insulating film and the oxidation-resistant conductor film; the step (e) of forming a third insulating film on the second insulating film; the step (f) of removing, using a photoresist as a mask, portions of the third insulating film and the second insulating film located above the interconnect layer; and the step (g) of removing the photoresist.

With this method, the oxidation-resistant conductor film can cover the top of the interconnect layer. Therefore, in the step (f), even if treatment that may corrode metal, such as ashing, is carried out after exposure of the oxidation-resistant conductor film, corrosion of the interconnect layer can be prevented. On the other hands, all portions of the second insulating film but the portion located on the interconnect layer are not formed thick. Therefore, in the semiconductor device fabricated by the second method, the dielectric constant between the layers can be kept constant.

In the step (c), plasma treatment, wet treatment, or ion implantation may be performed to introduce nitrogen into an upper portion of the interconnect layer, thereby forming the oxidation-resistant conductor film.

In the step (c), a film containing nitrogen may be deposited, as the oxidation-resistant conductor film, on the interconnect layer.

In the step (b), a first interconnect layer for a seal ring and a second interconnect layer located in a region surrounded with the first interconnect layer may be formed as the interconnect layer. In the step (c), an oxidation-resistant conductor film may be formed on the first interconnect layer and the second interconnect layer. In the step (f), portions of the third insulating film and the second insulating film located above the first interconnect layer may be partly removed to form a trench for the seal ring, and portions of the third insulating film and the second insulating film located above the second interconnect layer may be partly removed to form a hole. Since, in this case, the opening area of the trench is greater than that of the hole, the trench is formed to have a greater depth than the hole in the step (f). However, the region of the second insulating film to be formed with the trench is formed thick, whereby it can become difficult to expose the first interconnect layer.

The second method may further comprise, prior to the step (a), the step (h) of forming an element in the semiconductor substrate, and in the step (b), the interconnect layer may be formed to be electrically connectable to the element. In this case, even though an error in the depth to be removed arises in the step (f), it can become difficult to expose the interconnect layer.

BRIEF DESCRIPTION OF THE DRAWINGS

FIGS. 6A to 6E are planar views of the first metal interconnect, the hole-contact portion, the second metal interconnect, and the trench-contact portion of embodiments 1-4.

DETAILED DESCRIPTION OF THE PREFERRED EMBODIMENTS

First Embodiment

Hereinafter, a method for fabricating a semiconductor device according to a first embodiment of the present invention will be described with reference to FIGS. 1A to 1F. FIGS. 1A to 1F are sectional views showing the semiconductor device fabrication method of the first embodiment. Note that FIGS. 1A to 1F show an interconnect formation region R1 and a seal ring region R2 for protecting the interconnect formation region R1 against outside moisture. The seal ring region R2 surrounds the sides of the interconnect formation region R1.

Figure 1A:
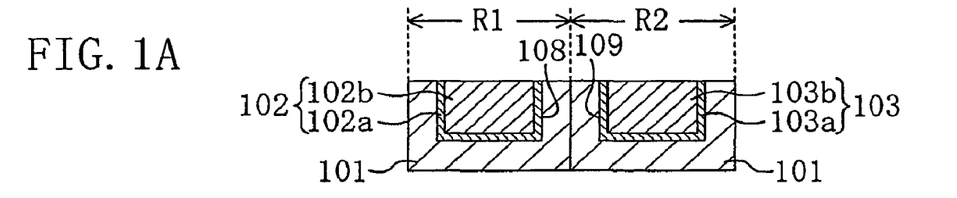
FIGS. 1A to 1F are sectional views showing a semiconductor device fabrication method according to a first embodiment.

First, in the step shown in FIG. 1A, a first insulating film 101 of a silicon oxide film having a thickness of 500 nm is formed on a silicon substrate (not shown). On the first insulating film 101, a photoresist (not shown) having openings in interconnect trace formation positions is formed by photolithography. The formed photoresist is used as a mask to perform dry etching, thereby removing part of the first insulating film 101 to form interconnect grooves 108 and 109 with a depth of 250 nm. Thereafter, the photoresist is removed, and then a 30 nm-thick stacked film (not shown) of tantalum nitride and tantalum and a 1000 nm-thick copper film (not shown) are formed above the substrate. The copper film and the stacked film are polished using chemical mechanical polishing to form, in the interconnect formation region R1, a first metal interconnect 102 consisting of a conductor surface film 102a and a metal interconnect film 102b. The conductor surface film 102a covers the inside surface of the interconnect groove 108, and the metal interconnect film 102b fills the interconnect groove 108 with the conductor surface film 102a interposed between the first insulating film 101 and the metal interconnect film 102b. During this formation, in the seal ring region R2, a second metal interconnect 103 is formed which consists of a conductor surface film 103a and a metal interconnect film 103b.

Figure 1B:
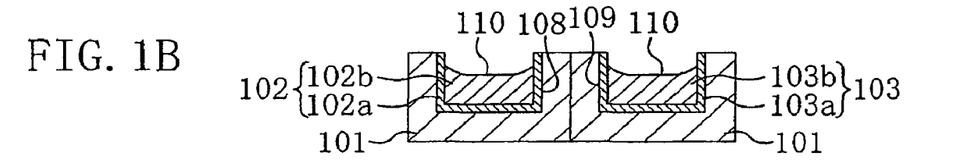

In the step shown in FIG. 1B, by chemical mechanical polishing or selective metal etching with nitric acid or the like, the upper portions of the first metal interconnect 102 and the second metal interconnect 103 are recessed to form recessed shapes (recesses 110) having depths of about 20 to 40 nm.

Figure 1C:
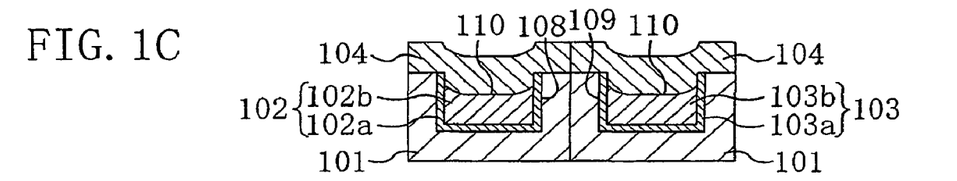

Next, in the step shown in FIG. 1C, on the substrate, a second insulating film 104 is deposited which is made of a silicon carbon nitride film with a thickness of 100 to 150 nm and which fills the recess 110. In this deposition, as the material for the second insulating film 104, use may be made of a silicon nitride film, a silicon carbide film, a silicon oxycarbide film, or the like. Also, a structure made by stacking the listed films may be formed as the second insulating film 104.

At the time of this deposition, depressions affected by the recess shapes of the first metal interconnect 102 and the second metal interconnect 103 are created in the upper surface of the second insulating film 104.

Figure 1D:
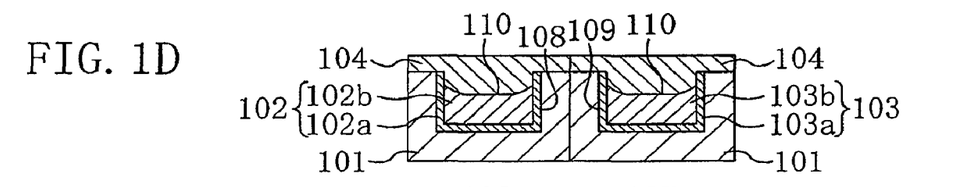

Then, in the step shown in FIG. 1D, chemical mechanical polishing, wet etching with sulfuric acid, nitric acid, or the like or etch back is performed to planarize the upper surface of the second insulating film 104. By this planarization, portions of the second insulating film 104 located on the first metal interconnect 102 and the second metal interconnect 103 have thicknesses of about 70 to 90 nm and the remaining portions thereof have a thickness of 50 nm.

Figure 1E:
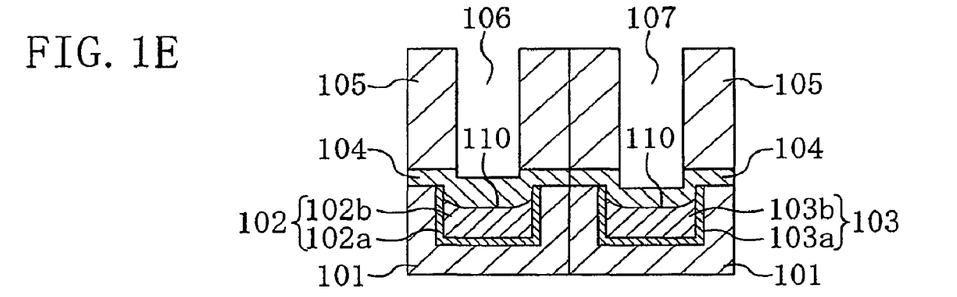

In the step shown in FIG. 1E, a third insulating film 105 made of a carbon-containing silicon oxide film is deposited above the substrate. In this deposition, as the third insulating film 105, use may be made of an FSG (fluorinated silicate glass) film, a BPSG (boron phosphorus silicate glass) film, or a porous film. Also, a structure made by stacking the listed films may be used as the third insulating film 105.

Subsequently to this, by photolithography, a photoresist (not shown) having openings in a hole formation region and a trench formation region is formed on the third insulating film 105. Then, dry etching is performed using the photoresist as a mask to form a hole (through hole) 106 in the interconnect formation region R1 and a trench 107 in the seal ring region R2. This dry etching is performed so that the hole 106 and the trench 107 extend halfway through the second insulating film 104. Since, in this etching, the opening area of the trench 107 is greater than that of the hole 106, the trench 107 is etched deeper. Thereafter, the photoresist is removed by ashing, and polymers created during wet etching and dry etching are removed.

Figure 1F:
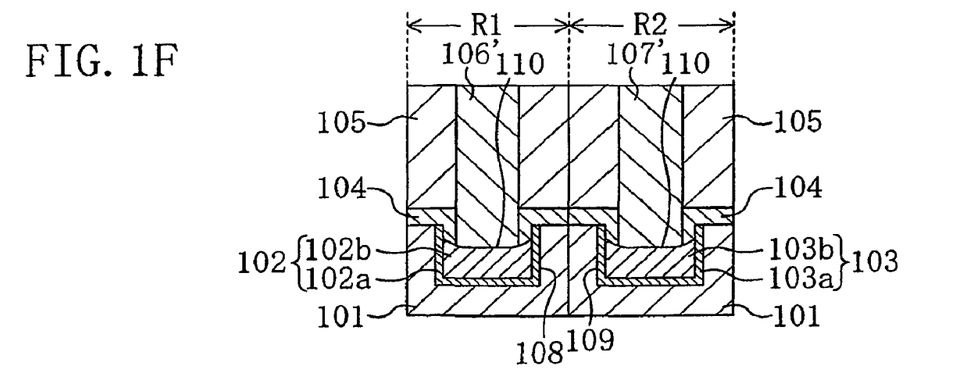

In the step shown in FIG. 1F, the remaining portions of the second insulating film 104 within the hole and trench are etched, whereby the hole 106 and the trench 107 reach the first metal interconnect 102 and the second metal interconnect 103, respectively. The resulting hole and trench are filled with a conductor to form a hole-contact portion 106' made of conductor (referred hereinafter to as a conductor hole-contact portion) in circular or square plane and a trench-contact portion 107' of conductor (referred hereinafter to as a conductor trench-contact portion) in ring shape. This step is performed after completion of processes that may corrode metal, such as ashing and polymer removal.

With reference to FIG. 1F again, next description will now be made of the structure of the interconnect and the seal ring of the semiconductor device according to the first embodiment.

As shown in FIG. 1F, the semiconductor device of the first embodiment includes the interconnect formation region R1 and the seal ring region R2 surrounding the sides of the interconnect formation region R1. The interconnect formation region R1 is provided with the first metal interconnect 102, and the seal ring region R2 is provided with the second metal interconnect 103. The first metal interconnect 102 includes the conductor surface film 102a covering the surface of the interconnect groove 108 and the metal interconnect film 102b covering the conductor surface film 102a. Likewise, the second metal interconnect 103 includes the conductor surface film 103a covering the surface of the interconnect groove 109 and the metal interconnect film 103b provided on the conductor surface film 103a. The upper portions of the first metal interconnect 102 and the second metal interconnect 103 are recessed to form the recesses 110.

The second insulating film 104 is provided on the first insulating film 101, the first metal interconnect 102 and the second metal interconnect 103. The second insulating film 104 fills the recess 110, so that in the second insulating film 104, the portions thereof located on the first metal interconnect 102 and the second metal interconnect 103 are formed thicker than the other portions thereof. The upper surface of the second insulating film 104 is planarized.

The third insulating film 105 is provided on the second insulating film 104. The interconnect formation region R1 is provided with the conductor hole-contact portion 106' passing through the third insulating film 105 and the second insulating film 104. Likewise, the seal ring region R2 is formed with the conductor trench-contact portion 107'. Thus, in the seal ring region R2, the seal ring in ring shape formed of the second metal interconnect 103 and the conductor trench-contact portion 107' is provided to surround the first metal interconnect 102 and the conductor hole-contact portion 106' in the interconnect formation region R1.

The effects obtained by the first embodiment will be described below in comparison with the conventional device.

In the conventional device, the upper surfaces of the first metal interconnect and the second metal interconnect remain flat, and the second insulating film with a uniform thickness is formed on the first metal interconnect and the second metal interconnect. By such a structure, when the hole and the trench are formed, the trench might pass through the second insulating film to expose the second metal interconnect.

In contrast to this, in the first embodiment, only the portions of the second insulating film 104 located on the first metal interconnect 102 and the second metal interconnect 103 can be formed thick. This prevents the trench 107 from reaching the second metal interconnect 103. Therefore, even if ashing and polymer removal are performed on the semiconductor surface, the first metal interconnect 102 will not corrode. On the other hands, the portion of the second insulating film 104 located on the first insulating film 101 is not formed thick. Therefore, the dielectric constant between the layers can be kept constant.

Moreover, chemical mechanical polishing or selective etching is performed to recess the upper surfaces of the first metal interconnect 102 and the second metal interconnect 103. This improves the adhesion between the first insulating film 101 and the second insulating film 104.

In the first embodiment, by chemical mechanical polishing or the like, the recessed shapes are formed in the upper portions of the first metal interconnect 102 and the second metal interconnect 103. However, in the present invention, the recessed shape may be formed by utilizing the property of copper in which copper is compressed by heat added thereto. To be more specific, in the step shown in FIG. 1A, the first metal interconnect 102 and the second metal interconnect 103 are formed and then heat treatment is performed at 200 to 500° C. This compresses the metal interconnect films 102b and 103b made of copper to form recesses in the upper portions of the first metal interconnect 102 and the second metal interconnect 103. Also by this procedure, the same effects as those described above can be obtained.

Second Embodiment

Hereinafter, a method for fabricating a semiconductor device according to a second embodiment of the present invention will be described with reference to FIGS. 2A to 2F. FIGS. 2A to 2F are sectional views showing the semiconductor device fabrication method of the second embodiment. Note that FIGS. 2A to 2F show an interconnect formation region R1 and a seal ring region R2 for protecting the interconnect formation region R1 against outside moisture. The seal ring region R2 surrounds the sides of the interconnect formation region R1.

Figure 2A:
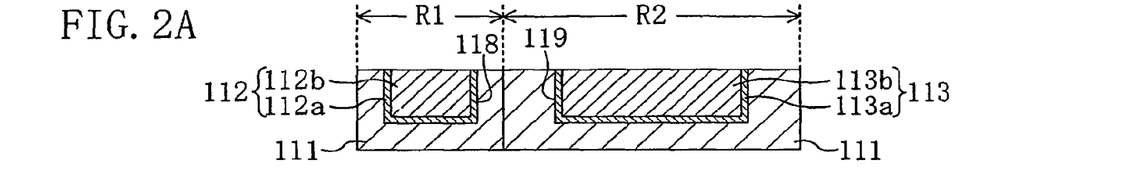
FIGS. 2A to 2F are sectional views showing a semiconductor device fabrication method according to a second embodiment.

First, in the step shown in FIG. 2A, a first insulating film 111 of a silicon oxide film having a thickness of 500 nm is formed on a silicon substrate (not shown). On the first insulating film 111, a photoresist (not shown) having openings in a metal interconnect trace formation region is formed by photolithography. The formed photoresist is used as a mask to perform dry etching, thereby forming an interconnect groove 118 in the interconnect formation region R1 and an interconnect groove 119 in the seal ring formation region R2. In this etching, the width of the interconnect groove 119 is made greater than that of the interconnect groove 118. To be more specific, when the interconnect groove 118 has a width smaller than 2 µm, the interconnect groove 119 has a width of 2 µm or greater.

Thereafter, the photoresist is removed, and then a 30 nm-thick stacked film (not shown) of tantalum nitride and tantalum and a 1000 nm-thick copper film (not shown) are formed above the substrate. The copper film and the stacked film are polished using chemical mechanical polishing to form, in the interconnect formation region R1, a first metal interconnect 112 having a width of 2 µm or greater and consisting of a conductor surface film 112a and a metal interconnect film 112b. The conductor surface film 112a covers the inside surface of the interconnect groove 118, and the metal interconnect film 112b fills the interconnect groove 118 with the conductor surface film 112a interposed between the first insulating film 111 and the metal interconnect film 112b. During this formation, in the seal ring region R2, a second metal interconnect 113 with a width of 2 µm or greater is formed which consists of a conductor surface film 113a and a metal interconnect film 113b.

Figure 2B:
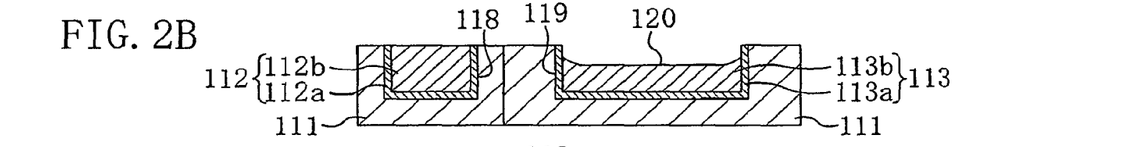

In the step shown in FIG. 2B, chemical mechanical polishing is performed. In this step, the upper portion of the second metal interconnect 113 is recessed by utilizing the metal area ratio dependence of dishing. Details of this step are as follows. If a substrate with metal embedded therein is subjected to chemical mechanical polishing, the depth to which the metal is removed tends to be greater as the percentage of metal contained in the region to be removed rises. In the second embodiment, the second metal interconnect 113 is formed to have a greater width than the first metal interconnect 112. In other words, the region where the second metal interconnect 113 is formed has a higher ratio of metal per unit area. This allows the upper portion of the second metal interconnect 113 to be recessed deeper than the other regions.

As a substitute for the method in which the depth of the second metal interconnect 113 is made greater than that of the first metal interconnect 112, the percentage of metal content per unit area may be raised by forming a dummy pattern around the second metal interconnect 113.

Figure 2C:
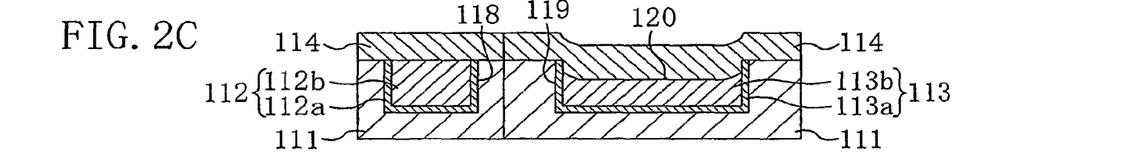

Next, in the step shown in FIG. 2C, a second insulating film 114 made of a silicon carbon nitride film is deposited on the first insulating film 111, the first metal interconnect 112 and the second metal interconnect 113. In this deposition, as the material for the second insulating film 114, use may be made of a silicon nitride film, a silicon oxide film, a silicon oxycarbide film, or the like. Also, a structure made by stacking the listed films may be formed as the second insulating film 114.

At the time of this deposition, a depression affected by the recess shape of the second metal interconnect 113 is created in the upper portion of the second insulating film 114.

Figure 2D:
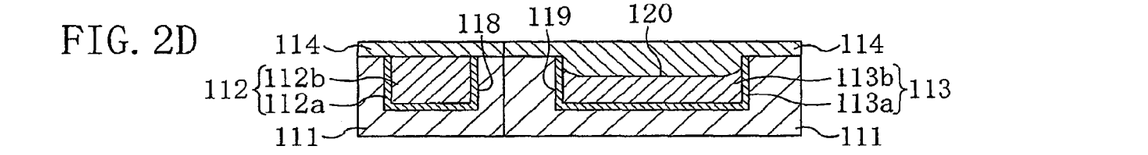

Then, in the step shown in FIG. 2D, chemical mechanical polishing, wet etching, or etch back is performed to planarize the second insulating film 114.

Figure 2E:
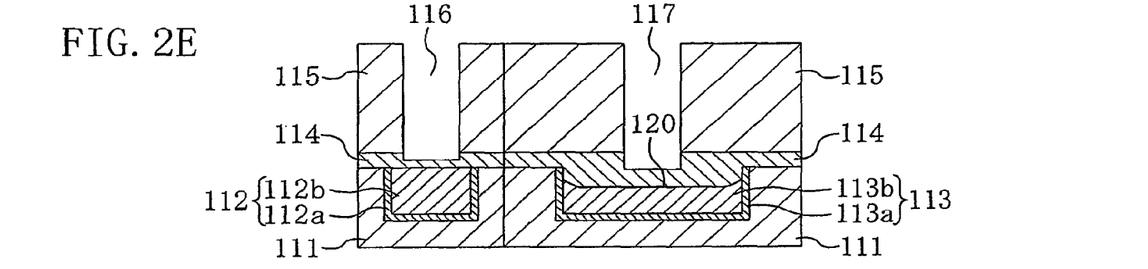

In the step shown in FIG. 2E, a third insulating film 115 made of a carbon-containing silicon oxide film is deposited above the substrate. In this deposition, as the third insulating film 115, use may be made of an FSG (fluorinated silicate glass) film, a BPSG (boron phosphorus silicate glass) film, or a porous film. Also, a structure made by stacking the listed films may be used as the third insulating film 115.

Subsequently to this, by photolithography, a photoresist (not shown) having openings in a hole formation region and a trench formation region is formed on the third insulating film 115. Then, dry etching is performed using the photoresist as a mask to form a hole 116 in the interconnect formation region R1 and a trench 117 in the seal ring region R2. This dry etching is performed so that the trench 117 extends halfway through the second insulating film 114. Since, in this etching, the opening area of the trench 117 is greater than that of the hole 116, the trench 117 is etched deeper. Thereafter, the photoresist is removed by ashing, and polymers created during wet etching and dry etching are removed.

Figure 2F:
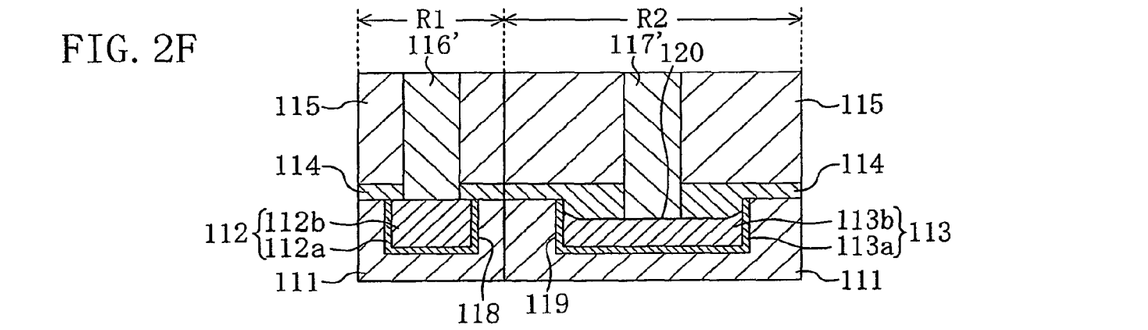

In the step shown in FIG. 2F, the remaining portions of the second insulating film 114 within the hole and trench are removed, whereby the hole 116 and the trench 117 reach the first metal interconnect 112 and the second metal interconnect 113, respectively. The resulting hole and trench are filled with a conductor to form a conductor hole-contact portion 116' in circular or square plane and a conductor trench-contact portion 117' in ring shape. This step is performed after completion of processes that may corrode metal, such as ashing and polymer removal.

With reference to FIG. 2F again, next description will now be made of the structure of the interconnect and the seal ring of the semiconductor device according to the second embodiment.

As shown in FIG. 2F, the semiconductor device of the second embodiment includes the interconnect formation region R1 and the seal ring region R2 surrounding the sides of the interconnect formation region R1. The interconnect formation region R1 is provided with the first metal interconnect 112, and the seal ring region R2 is provided with the second metal interconnect 113. The second metal interconnect 113 is formed to have a greater width than the first metal interconnect 112.

The first metal interconnect 112 includes the conductor surface film 112a covering the surface of the interconnect groove 118 and the metal interconnect film 112b covering the conductor surface film 112a. Likewise, the second metal interconnect 113 includes the conductor surface film 113a covering the surface of the interconnect groove 119 and the metal interconnect film 113b provided on the conductor surface film 113a. The upper portion of the second metal interconnect 113 is recessed to form a recess 120.

The second insulating film 114 is provided on the first insulating film 111, the first metal interconnect 112 and the second metal interconnect 113. The second insulating film 114 fills the recess 120, so that in the second insulating film 114, the portion thereof located on the second metal interconnect 113 is formed thicker than the other portions thereof. The upper surface of the second insulating film 114 is planarized.

The third insulating film 115 is provided on the second insulating film 114. The interconnect formation region R1 is provided with the conductor hole-contact portion 116' passing through the third insulating film 115 and the second insulating film 114. Likewise, the seal ring region R2 is formed with the conductor trench-contact portion 117'. Thus, in the seal ring region R2, the seal ring in ring shape formed of the second metal interconnect 113 and the conductor trench-contact portion 117' is provided to surround the first metal interconnect 112 and the conductor hole-contact portion 116' in the interconnect formation region R1.

The effects obtained by the second embodiment will be described below in comparison with the conventional device.

In the conventional device, the upper surface of the second metal interconnect remains flat, and the second insulating film with a uniform thickness is formed on the second metal interconnect. By such a structure, when the hole and the trench are formed, the trench might pass through the second insulating film to expose the second metal interconnect.

In contrast to this, in the second embodiment, only the portion of the second insulating film 114 located on the second metal interconnect 113 can be formed thick without increasing the number of fabrication steps of the device. This prevents the trench 117 from reaching the second metal interconnect 113. Therefore, even if ashing and polymer removal are performed on the semiconductor surface, the first metal interconnect will not corrode. On the other hands, the portion of the second insulating film 114 located on the first insulating film 111 is not formed thick. Therefore, the dielectric constant between the layers can be kept constant.

Moreover, chemical mechanical polishing or etching is performed to recess the upper portion of the second metal interconnect 113. This improves the adhesion between the first insulating film 111 and the second insulating film 114.

In the second embodiment, the recessed shape is formed by utilizing the metal area ratio dependence of dishing. However, it may be formed by etching utilizing the pattern density dependence. Alternatively, in the step shown in FIG. 2B in the present invention, the recessed shape may be formed in the upper portion of the second metal interconnect 113 by performing etching with a photoresist or the like covering all the region but the second metal interconnect 113. In this case, the same effects as those described above can be obtained except that the number of fabrication steps of the device increases.

In the second embodiment, in performing chemical mechanical polishing in the step shown in FIG. 2B, slurry with high solubility, such as hydrogen peroxide, may be used. This raises the polishing rate of metal, which allows the second metal interconnect 113 to be recessed deeper.

Third Embodiment

A method for fabricating a semiconductor device according to a third embodiment of the present invention will be described with reference to FIGS. 3A to 3E. FIGS. 3A to 3E are sectional views showing the semiconductor device fabrication steps of the third embodiment. Note that FIGS. 3A to 3E show an interconnect formation region R1 and a seal ring region R2 for protecting the interconnect formation region R1 against outside moisture. The seal ring region R2 surrounds the sides of the interconnect formation region R1.

Figure 3A:
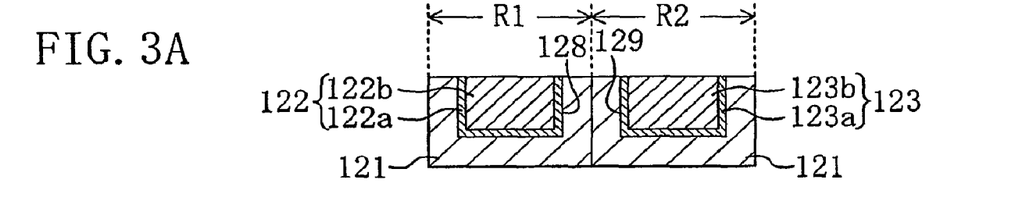
FIGS. 3A to 3E are sectional views showing a semiconductor device fabrication method according to a third embodiment.

First, in the step shown in FIG. 3A, a first insulating film 121 of a silicon oxide film having a thickness of 500 nm is formed on a silicon substrate (not shown). On the first insulating film 121, a photoresist (not shown) having openings in a metal interconnect trace formation region is formed by photolithography. The formed photoresist is used as a mask to perform dry etching, thereby removing part of the first insulating film 121 to form interconnect grooves 128 and 129 with a depth of 250 nm. Thereafter, the photoresist is removed, and then a 30 nm-thick stacked film (not shown) of tantalum nitride and tantalum and a 1000 nm-thick copper film (not shown) are formed above the substrate. The copper film and the stacked film are polished using chemical mechanical polishing to form, in the interconnect formation region R1, a first metal interconnect 122 consisting of a conductor surface film 122a and a metal interconnect film 122b. The conductor surface film 122a covers the inside surface of the interconnect groove 128, and the metal interconnect film 122b fills the interconnect groove 128 with the conductor surface film 122a interposed between the first insulating film 121 and the metal interconnect film 122b. During this formation, in the seal ring region R2, a second metal interconnect 123 is formed which consists of a conductor surface film 123a and a metal interconnect film 123b.

Figure 3B:
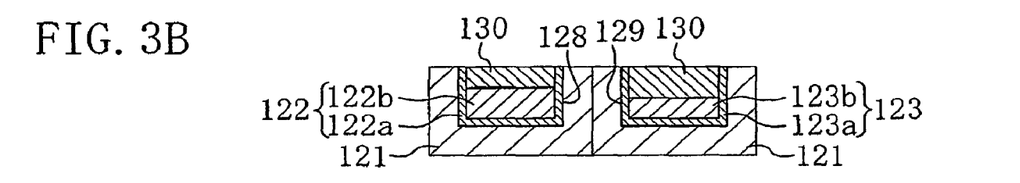

In the step shown in FIG. 3B, plasma treatment using a gas containing nitrogen, wet treatment using ammonia, benzotriazole (BTA), or quinaldic acid, or ion implantation is performed to supply nitrogen to the upper portions of the first metal interconnect 122 and the second metal interconnect 123. This alters the upper portions of the first metal interconnect 122 and the second metal interconnect 123 into an oxidation resistant film 130. Simultaneously, this step can improve the adhesion between the first insulating film 121 and a second insulating film 124 that will be formed in a subsequent step.

Figure 3C:
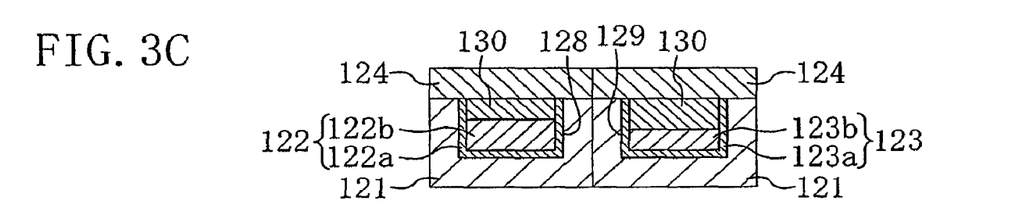

Next, in the step shown in FIG. 3C, the second insulating film 124 made of a silicon carbon nitride film is deposited on the first insulating film 121 and the oxidation resistant film 130. In this deposition, as the material for the second insulating film 124, use may be made of a silicon nitride film, a silicon carbide film, a silicon oxycarbide film, or the like. Also, a structure made by stacking the listed films may be formed as the second insulating film 124.

Figure 3D:
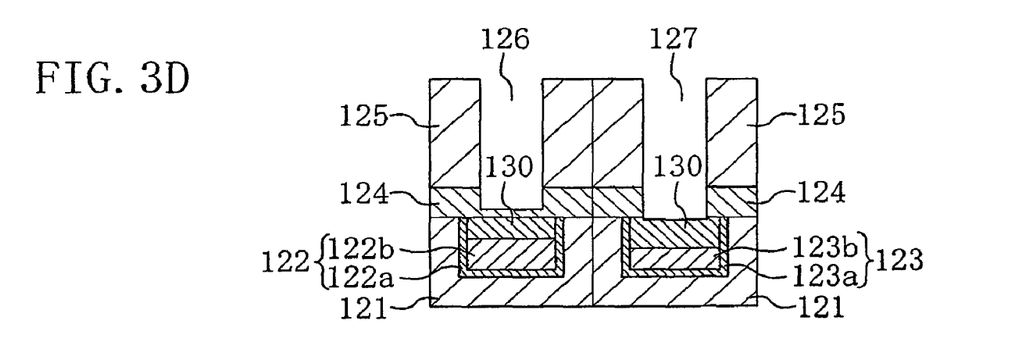

In the step shown in FIG. 3D, a third insulating film 125 made of a carbon-containing silicon oxide film is deposited above the substrate. In this deposition, as the third insulating film 125, use may be made of an FSG (fluorinated silicate glass) film, a BPSG (boron phosphorus silicate glass) film, or a porous film. Also, a structure made by stacking the listed films may be used as the third insulating film 125.

Subsequently to this, by photolithography, a photoresist (not shown) having openings in a hole formation region and a trench formation region is formed on the third insulating film 125. Then, dry etching is performed using the photoresist as a mask to form a hole 126 in the interconnect formation region R1 and a trench 127 in the seal ring region R2. This dry etching may be performed either so that the trench 127 extends only halfway through the second insulating film 124 or so that the trench 127 passes through the second insulating film 124 to reach the oxidation resistant film 130. Thereafter, the photoresist is removed by ashing, and polymers created during wet etching and dry etching are removed.

Figure 3E:
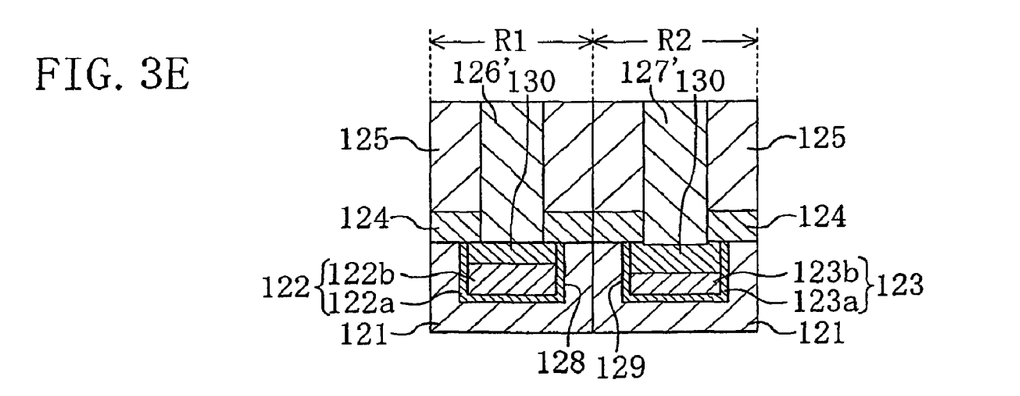

In the step shown in FIG. 3E, the remaining portions of the second insulating film 124 within the hole and trench are removed, whereby the hole 126 and the trench 127 reach the oxidation resistant film 130. The resulting hole and trench are filled with a conductor to form a conductor hole-contact portion 126' in circular or square plane and a conductor trench-contact portion 127' in ring shape.

With reference to FIG. 3E again, next description will now be made of the structure of the interconnect and the seal ring of the semiconductor device according to the third embodiment.

As shown in FIG. 3E, the semiconductor device of the third embodiment includes the interconnect formation region R1 and the seal ring region R2 surrounding the sides of the interconnect formation region R1. The interconnect formation region R1 is provided with the first metal interconnect 122, and the seal ring region R2 is provided with the second metal interconnect 123. The first metal interconnect 122 includes the conductor surface film 122a covering the surface of the interconnect groove 128 and the metal interconnect film 122b covering the conductor surface film 122a. Likewise, the second metal interconnect 123 includes the conductor surface film 123a covering the surface of the interconnect groove 129 and the metal interconnect film 123b provided on the conductor surface film 123a. The upper portions of the metal interconnect films 122b and 123b contain nitrogen and thus are formed into the oxidation resistant film 130.

The second insulating film 124 is provided on the first insulating film 121, the first metal interconnect 122 and the second metal interconnect 123. The third insulating film 125 is provided on the second insulating film 124. The interconnect formation region R1 is provided with the conductor hole-contact portion 126' passing through the third insulating film 125 and the second insulating film 124. Likewise, the seal ring region R2 is formed with the conductor trench-contact portion 127'. Thus, in the seal ring region R2, the seal ring in ring shape formed of the second metal interconnect 123 and the conductor trench-contact portion 127' is provided to surround the first metal interconnect 122 and the conductor hole-contact portion 126' in the interconnect formation region R1.

The effects obtained by the third embodiment will be described below in comparison with the conventional device.

In the conventional device, if a trench reaches the second metal interconnect during formation of the hole pattern and the trench pattern, then the second metal interconnect corrodes in subsequent ashing and polymer removal.

In contrast to this, in the third embodiment, the upper portion of the second metal interconnect 123 is altered into the oxidation resistant film 130. Therefore, even if ashing and polymer removal are performed in the state in which the trench 127 reaches the second metal interconnect 123, the upper portion of the second metal interconnect 123 will not corrode. On the other hands, the portion of the second insulating film 124 located on the first insulating film 121 is not formed thick. Therefore, the dielectric constant between the layers can be kept constant.

Moreover, the upper portions of the first metal interconnect 122 and the second metal interconnect 123 are made to contain nitrogen, which also provides the advantage that the etching resistance in the formation of the hole 126 and the trench 127 is improved.

In the step shown in FIG. 3D, in the case where the hole 126 and the trench 127 reach the oxidation resistant film 130, the later step of removing portions of the second insulating film 124 remaining between the oxidation resistant film 130 and each of the hole 126 and the trench 127 can be advantageously omitted.

Fourth Embodiment

A method for fabricating a semiconductor device according to a fourth embodiment of the present invention will be described with reference to FIGS. 4A to 4E. FIGS. 4A to 4E are sectional views showing the semiconductor device fabrication steps of the fourth embodiment. Note that FIGS. 4A to 4E show an interconnect formation region R1 and a seal ring region R2 for protecting the interconnect formation region R1 against outside moisture. The seal ring region R2 surrounds the sides of the interconnect formation region R1.

Figure 4A:
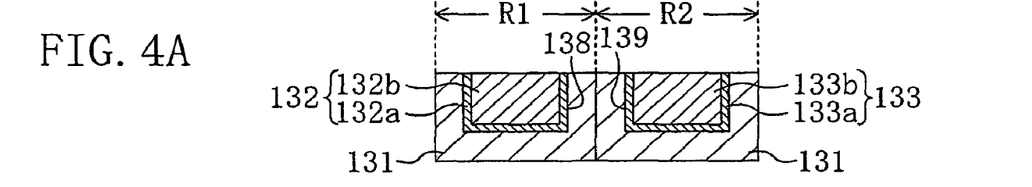
FIGS. 4A to 4E are sectional views showing a semiconductor device fabrication method according to a fourth embodiment.

First, in the step shown in FIG. 4A, a first insulating film 131 of a silicon oxide film having a thickness of 500 nm is formed on a silicon substrate (not shown). On the first insulating film 131, a photoresist (not shown) having openings in a metal interconnect trace formation region is formed by photolithography. The formed photoresist is used as a mask to perform dry etching, thereby removing part of the first insulating film 131 to form interconnect grooves 138 and 139 with a depth of 250 nm. Thereafter, the photoresist is removed, and then a 30 nm-thick stacked film (not shown) of tantalum nitride and tantalum and a 1000 nm-thick copper film (not shown) are formed above the substrate. The copper film and the stacked film are polished using chemical mechanical polishing to form, in the interconnect formation region R1, a first metal interconnect 132 consisting of a conductor surface film 132a and a metal interconnect film 132b. The conductor surface film 132a covers the inside surface of the interconnect groove 138, and the metal interconnect film 132b fills the interconnect groove 138 with the conductor surface film 132a interposed between the first insulating film 131 and the metal interconnect film 132b. During this formation, in the seal ring region R2, a second metal interconnect 133 is formed which consists of a conductor surface film 133a and a metal interconnect film 133b.

Figure 4B:
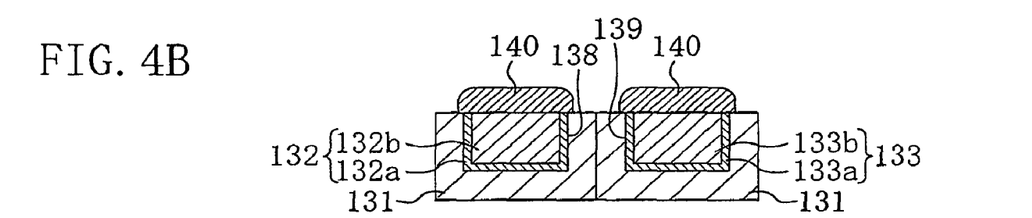

In the step shown in FIG. 4B, an oxidation-resistant metal film 140 is selectively deposited on the first metal interconnect 132 and the second metal interconnect 133. An exemplary material for the metal film 140 is titanium nitride (TiN).

Figure 4C:
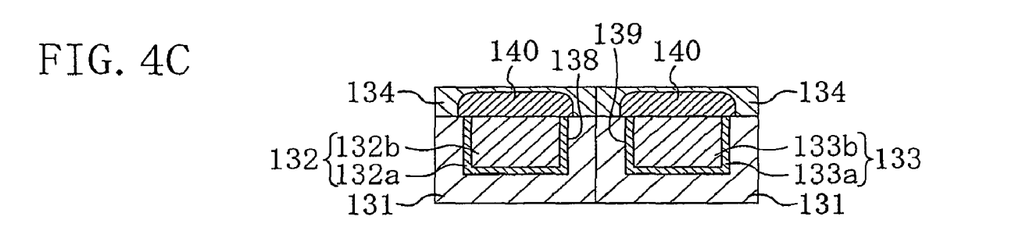

Next, in the step shown in FIG. 4C, a second insulating film 134 made of a silicon carbon nitride film is deposited on the first insulating film 131 and the metal film 140. In this deposition, as the material for the second insulating film 134, use may be made of a silicon nitride film, a silicon carbide film, a silicon oxycarbide film, or the like. Also, a structure made by stacking the listed films may be formed as the second insulating film 134. Subsequently to the deposition, chemical mechanical polishing, wet etching, or etch back is performed to planarize the second insulating film 134.

Figure 4D:
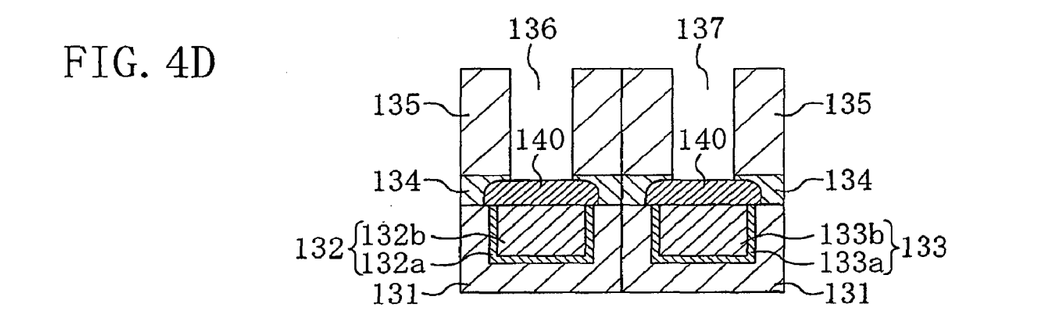

In the step shown in FIG. 4D, a third insulating film 135 made of a carbon-containing silicon oxide film is deposited above the substrate. In this deposition, as the third insulating film 135, use may be made of an FSG (fluorinated silicate glass) film, a BPSG (boron phosphorus silicate glass) film, or a porous film. Also, a structure made by stacking the listed films may be used as the third insulating film 135.

Subsequently to this, by photolithography, a photoresist (not shown) having openings in a hole formation region and a trench formation region is formed on the third insulating film 135. Then, dry etching is performed using the photoresist as a mask to form a hole 136 in the interconnect formation region R1 and a trench 137 in the seal ring region R2. This dry etching may be performed either so that the trench 137 extends only halfway through the second insulating film 134 or so that the trench 137 passes through the second insulating film 134 to reach the metal film 140. Thereafter, the photoresist is removed by ashing, and polymers created during wet etching and dry etching are removed.

Figure 4E:
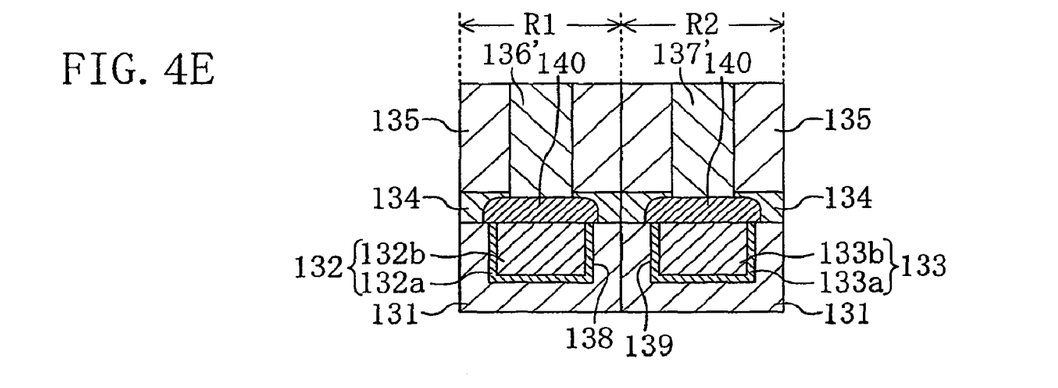

In the step shown in FIG. 4E, the remaining portions of the second insulating film 134 within the hole and trench are removed, whereby the hole 136 and the trench 137 reach the first metal interconnect 132 and the second metal interconnect 133, respectively. The resulting hole and trench are filled with a conductor to form a conductor hole-contact portion 136' in circular or square plane and a conductor trench-contact portion 137' in ring shape.

With reference to FIG. 4E again, next description will now be made of the structure of the interconnect and the seal ring of the semiconductor device according to the fourth embodiment.

As shown in FIG. 4E, the semiconductor device of the fourth embodiment includes the interconnect formation region R1 and the seal ring region R2 surrounding the sides of the interconnect formation region R1. The interconnect formation region R1 is provided with the first metal interconnect 132, and the seal ring region R2 is provided with the second metal interconnect 133. The first metal interconnect 132 includes the conductor surface film 132a covering the surface of the interconnect groove 138 and the metal interconnect film 132b covering the conductor surface film 132a. Likewise, the second metal interconnect 133 includes the conductor surface film 133a covering the surface of the interconnect groove 139 and the metal interconnect film 133b provided on the conductor surface film 133a.

The oxidation-resistant metal film 140 made of, for example, titanium nitride is provided on the first metal interconnect 132 and the second metal interconnect 133. The second insulating film 134 is provided on the first insulating film 131 and the metal film 140. The third insulating film 135 is provided on the second insulating film 134. The interconnect formation region R1 is provided with the conductor hole-contact portion 136' passing through the third insulating film 135 and the second insulating film 134. Likewise, the seal ring region R2 is formed with the conductor trench-contact portion 137'. Thus, in the seal ring region R2, the seal ring in ring shape formed of the second metal interconnect 133 and the conductor trench-contact portion 137' is provided to surround the first metal interconnect 132 and the conductor hole-contact portion 136' in the interconnect formation region R1.

In the fourth embodiment, the metal film 140 resistant to oxidation covers the top of the second metal interconnect 133. Therefore, even if ashing and polymer removal are performed in the state in which the trench 137 reaches the metal film 140, the upper portion of the second metal interconnect 133 will not corrode. On the other hands, the portion of the second insulating film 134 located on the first insulating film 131 is not formed thick. Therefore, the dielectric constant between the layers can be kept constant.

Moreover, the upper portions of the first metal interconnect 132 and the second metal interconnect 133 are formed with the metal film 140 resistant to oxidation, which also provides the advantage that the etching resistance in the formation of the hole 136 and the trench 137 is improved.

Fifth Embodiment

Hereinafter, a method for fabricating a semiconductor device according to a fifth embodiment of the present invention will be described with reference to FIGS. 5A to 5F. FIGS. 5A to 5F are sectional views showing a method for fabricating an interconnect region of a semiconductor device according to the fifth embodiment. The foregoing first to fourth embodiments have shown the case where a difference in depth arises between the hole in the interconnect region and the trench in the seal ring region. On the other hands, the fifth embodiment shows the case where in forming a number of hole patterns in the interconnect region, a difference in depth arises among the hole patterns.

Figure 5A:
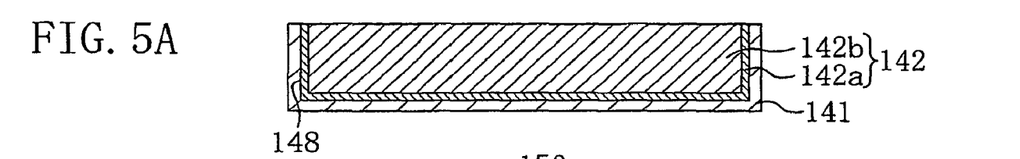
FIGS. 5A to 5F are sectional views showing a fabrication method of an interconnect region of a semiconductor device according to a fifth embodiment.

First, in the step shown in FIG. 5A, a first insulating film 141 of a silicon oxide film having a thickness of 500 nm is formed on a silicon substrate (not shown). On the first insulating film 141, a photoresist (not shown) having openings in a metal interconnect trace formation region is formed by photolithography. The formed photoresist is used as a mask to perform dry etching, thereby removing part of the first insulating film 141 to form an interconnect groove 148 with a depth of 250 nm. Thereafter, the photoresist is removed, and then a 30 nm-thick stacked film (not shown) of tantalum nitride and tantalum and a 1000 nm-thick copper film (not shown) are formed above the substrate. The copper film and the stacked film are polished using chemical mechanical polishing to form a metal interconnect 142 consisting of a conductor surface film 142a and a metal interconnect film 142b.

The conductor surface film 142a covers the inside surface of the interconnect groove 148, and the metal interconnect film 142b fills the interconnect groove 148 with the conductor surface film 142a interposed between the insulating film 141 and the metal interconnect film 142b.

Figure 5B:
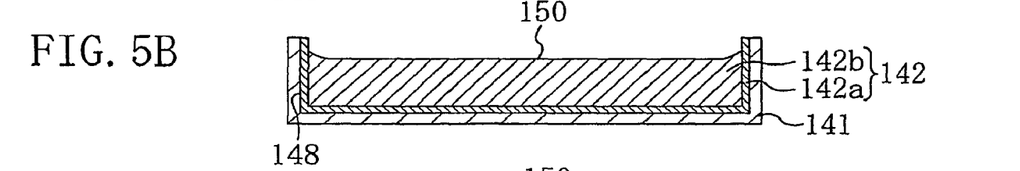

In the step shown in FIG. 5B, by chemical mechanical polishing or selective metal etching with nitric acid or the like, the upper portion of the metal interconnect 142 is recessed to form a recessed shape (recess 150) having a depth of about 20 to 40 nm.

Figure 5C:
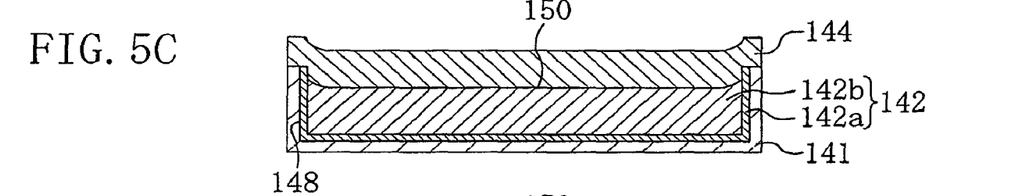

Next, in the step shown in FIG. 5C, on the substrate, a second insulating film 144 is deposited which is made of a silicon carbon nitride film with a thickness of 100 to 150 nm and which fills the recess 150. In this deposition, as the material for the second insulating film 144, use may be made of a silicon nitride film, a silicon carbide film, a silicon oxycarbide film, or the like. Also, a structure made by stacking the listed films may be formed as the second insulating film 144.

At the time of this deposition, a depression affected by the recess shape of the metal interconnect 142 is created in the top of the second insulating film 144.

Figure 5D:
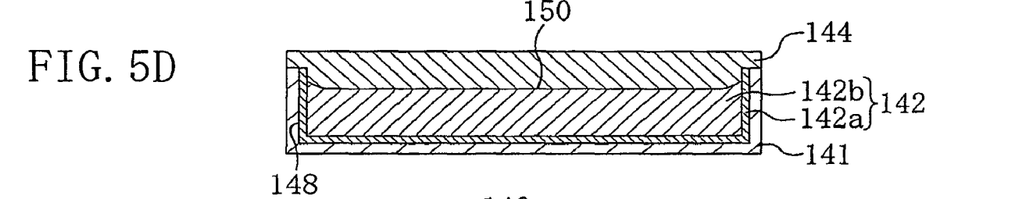

Then, in the step shown in FIG. 5D, chemical mechanical polishing, wet etching or etch back is performed to planarize the upper surface of the second insulating film 144. By this planarization, a portion of the second insulating film 144 located on the metal interconnect 142 has a thickness of about 70 to 90 nm and the remaining portions thereof have a thickness of 50 nm.

Figure 5E:
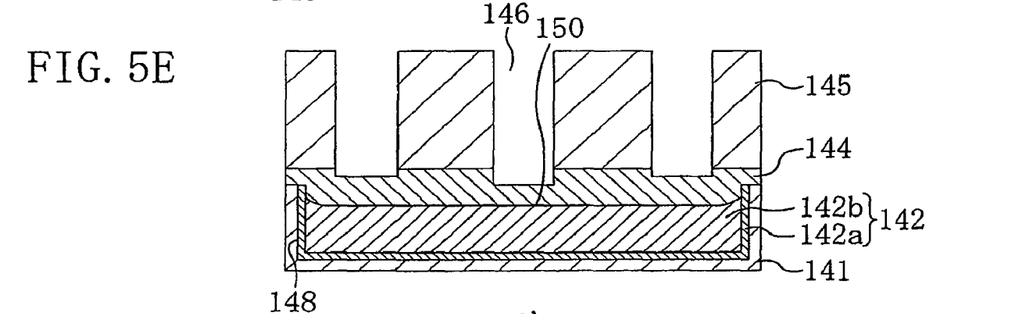

In the step shown in FIG. 5E, a third insulating film 145 made of a carbon-containing silicon oxide film is deposited above the substrate. In this deposition, as the third insulating film 145, use may be made of an FSG (fluorinated silicate glass) film, a BPSG (boron phosphorus silicate glass) film, or a porous film. Also, a structure made by stacking the listed films may be used as the third insulating film 145.

Subsequently to this, by photolithography, a photoresist (not shown) having openings in a hole formation region is formed on the third insulating film 145. Then, dry etching is performed using the photoresist as a mask to form holes 146. This dry etching is performed so that the holes 146 extend halfway through the second insulating film 144. At the time of completion of this etching, respective holes 146 of multiple hole patterns have different depths due to influences of the pattern density or the like. Thereafter, the photoresist is removed by ashing, and polymers created during wet etching and dry etching are removed.

Figure 5F:
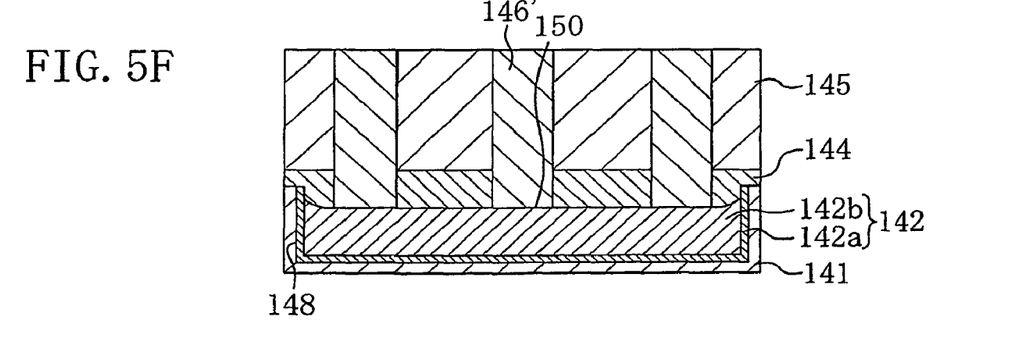
Figure 7A:
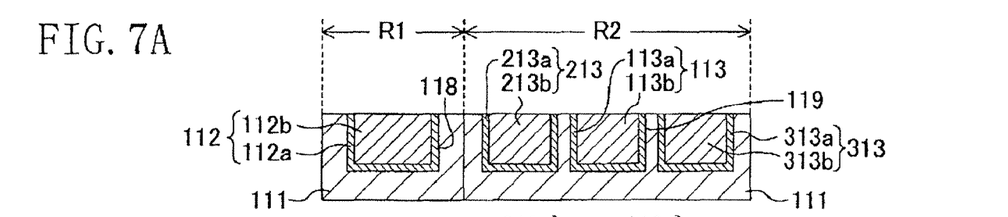
FIGS. 7A to 7F are views showing a method of forming a semiconductor device including dummy interconnects 213 (213a and 213b), and 313 (313a and 313b), which are formed adjacent the first interconnect layer 113 (113a and 113b).
Figure 7B:
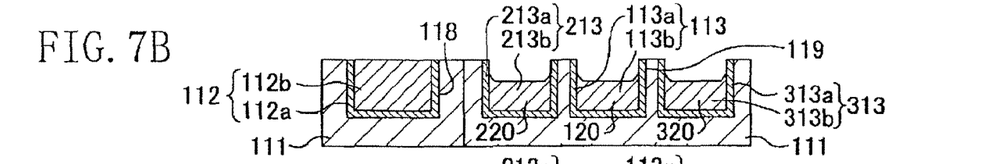
Figure 7C:
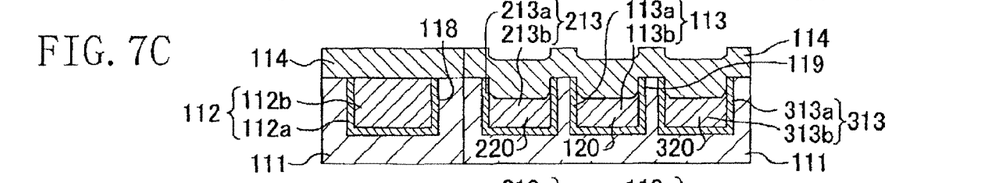
Figure 7D:
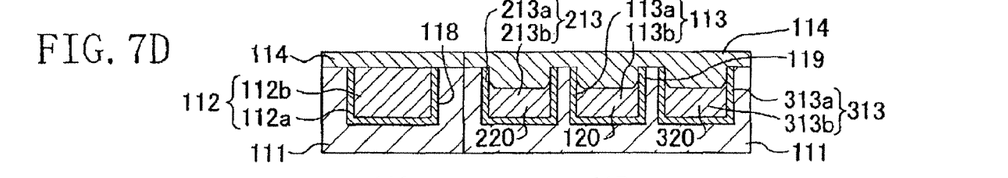
Figure 7E:
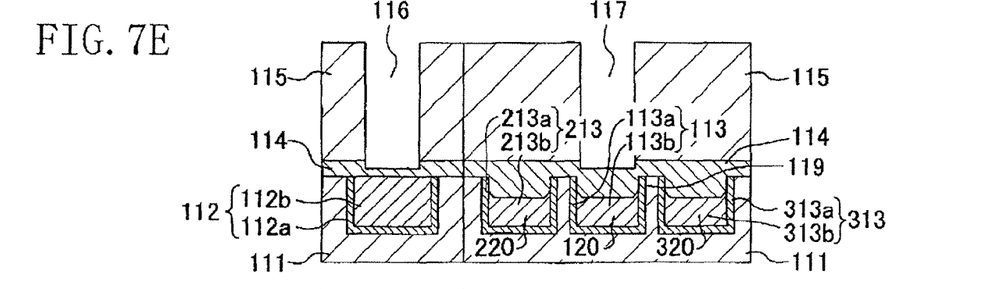
Figure 7F:
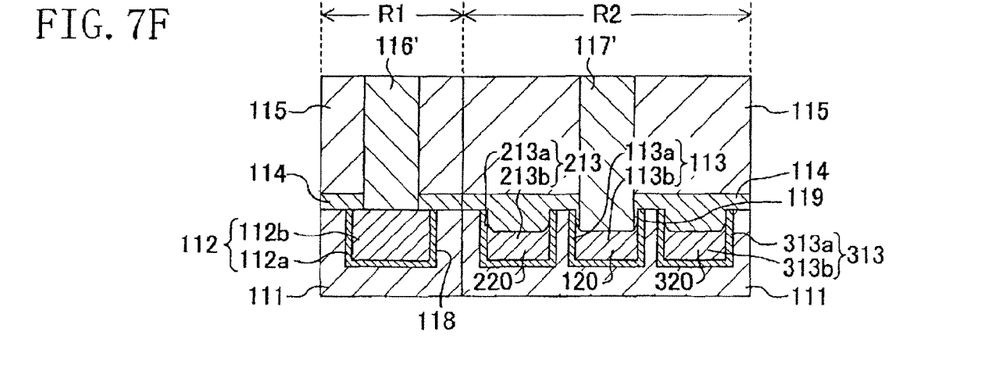

In the step shown in FIG. 5F, the remaining portions of the second insulating film 144 within the holes are removed, whereby the holes 146 reach the metal interconnect 142. The resulting holes are filled with a conductor to form conductor hole-contact portions 146' in circular or square plane. This step is performed after completion of processes that may corrode metal, such as ashing and polymer removal.

With reference to FIG. 5F again, next description will now be made of the structure of the interconnect and the conductor hole-contact portion of the semiconductor device according to the fifth embodiment.

As shown in FIG. 5F, in the semiconductor device of the fifth embodiment, the metal interconnect 142 which includes the conductor surface film 142a and the metal interconnect film 142b covering the top of the conductor surface film 142a is provided in the first insulating film 141. The upper portion of the metal interconnect 142 is recessed to form the recess 150.

The second insulating film 144 is provided on the first insulating film 141 and the metal interconnect 142. The second insulating film 144 fills the recess 150, so that in the second insulating film 144, the portion thereof located on the metal interconnect 142 is formed thicker than the other portions thereof. The upper surface of the second insulating film 144 is planarized.

The third insulating film 145 is provided on the second insulating film 144. Further, the conductor hole-contact portion 146' is provided which passes through the third insulating film 145 and the second insulating film 144.

The effects obtained by the fifth embodiment will be described below in comparison with the conventional device.

In the conventional device, the upper surface of the metal interconnect remains flat, and the second insulating film and the third insulating film are formed on the metal interconnect. If multiple types of hole patterns are formed in such a structure, the formed hole patterns have different hole depths due to nonuniform pattern densities or fabrication process variations. This might cause some of the hole patterns to pass through the second insulating film to reach the metal interconnect. Such a possibility increases particularly in the case where a number of hole patterns are formed in the device.

In contrast to this, in the fifth embodiment, only the portion of the second insulating film 144 located on the metal interconnect 142 can be formed thick. This prevents the holes 146 from reaching the metal interconnect 142. Therefore, even if ashing and polymer removal are performed on the semiconductor surface, the metal interconnect 142 will not corrode. On the other hands, the portion of the second insulating film 144 located on the first insulating film 141 is not formed thick. Therefore, the dielectric constant between the layers can be kept constant.

Moreover, chemical mechanical polishing or selective etching is performed to recess the upper surface of the metal interconnect 142. This improves the adhesion between the first insulating film 141 and the second insulating film 144.

The fifth embodiment is composed by applying the method of the first embodiment to the case where multiple types of hole patterns are formed in an interconnect region. However, in the present invention, methods of the third and fourth embodiments can also be applied to that case.

In the first to fourth embodiments, description has been made of the case where the conductor trench-contact portion is formed in ring shape to use the portion as the seal ring. Alternatively, the portion may be formed in rectangular shape or strip shape to use the portion as part of an electrode.

What is claimed is:

1. A method for fabricating a semiconductor device, comprising:

the step (a) of forming a first insulating film over a semiconductor substrate;

the step (b) of forming an interconnect layer in at least an upper portion of the first insulating film;

the step (c) of forming an oxidation-resistant conductor film covering the top of the interconnect layer;

the step (d) of forming a second insulating film on the first insulating film and the oxidation-resistant conductor film;

the step (e) of forming a third insulating film on the second insulating film;

the step (f) of removing, using a photoresist as a mask, portions of the third insulating film and the second insulating film located over the interconnect layer until the oxidation-resistant conductor film is exposed in one step; and the step (g) of removing the photoresist.

2. The method of claim 1, wherein in the step (c), plasma treatment, wet treatment, or ion implantation is performed to introduce nitrogen into an upper portion of the interconnect layer, thereby forming the oxidation-resistant conductor film.

3. The method of claim 1,
wherein in the step (c), a film containing nitrogen is deposited, as the oxidation-resistant conductor film, on the interconnect layer.

4. The method of claim 1,
wherein in the step (b), a first interconnect layer and a second interconnect layer are formed as the interconnect layer,
in the step (c), an oxidation-resistant conductor film is formed on the first interconnect layer and the second interconnect layer, and
in the step (f), portions of the third insulating film and the second insulating film located over the first interconnect layer are removed to form a trench, and portions of the third insulating film and the second insulating film located over the second interconnect layer are removed to form a hole.

5. The method of claim 1, further comprising, prior to the step (a), the step (h) of forming an element in the semiconductor substrate,
wherein in the step (b), the interconnect layer is formed to be electrically connectable to the element.

6. A method for fabricating a semiconductor device, comprising:
the step (a) of forming a first insulating film over a semiconductor substrate;
the step (b) of forming a first interconnect layer and a second interconnect layer in at least an upper portion of the first insulating film;
the step (c) of forming an oxidation-resistant conductor film covering tops of the first interconnect layer and the second interconnect layer;
the step (d) of forming a second insulating film on the first insulating film and the oxidation-resistant conductor film;
the step (e) of forming a third insulating film on the second insulating film;
the step (f) of forming a trench pattern by removing portions of the third insulating film and the second insulating film located over the first interconnect layer, and forming a part of a hole pattern by removing portions of the third insulating film and the second insulating film located over the second interconnect layer; and
the step (g) of removing portions of the second insulating film located over the second interconnect layer until the hole pattern reaches the oxidation-resistant conductor film.

7. The method of claim 6, wherein
in the step (f), when the trench pattern is formed, portions of the third insulating film and the second insulating film located over the first interconnect layer are removed until the oxidation-resistant conductor film is exposed in one step.

\* \* \* \* \*